United States Patent [19]

Nagasawa

[11] Patent Number: 5,122,682

[45] Date of Patent: Jun. 16, 1992

[54] SOURCE-COUPLED FET-LOGIC-TYPE LOGIC CIRCUIT

[75] Inventor: Hironori Nagasawa, Yokohama, Japan

[73] Assignee: Kabushiki Kaisha Toshiba, Kawasaki, Japan

[21] Appl. No.: 593,041

[22] Filed: Oct. 5, 1990

[30] Foreign Application Priority Data

Oct. 6, 1989 [JP] Japan ............................. 1-261573

[51] Int. Cl.⁵ .................. H03K 19/20; H03K 19/0175
[52] U.S. Cl. ..................................... 307/448; 307/475
[58] Field of Search ............... 307/448, 475, 529, 455; 328/25, 30

[56] References Cited

U.S. PATENT DOCUMENTS 4,806,796 2/1989 Bushey et al. ............... 307/455
4,968,904 11/1990 Yamashita et al. ........... 307/448

FOREIGN PATENT DOCUMENTS

WO 86/03078 5/1986 European Pat. Off.
0379443 7/1990 European Pat. Off.
2137384 10/1984 United Kingdom.

OTHER PUBLICATIONS

IBM Technical Disclosure Bulletin, vol. 32, No. 5B, Oct. 1989; "Enabled Flip-Flop for Frequency Division".
M. J. Delaney et al., 8179 IEEE Electron Device Letters, Aug. 10, 1989, No. 8, New York. "Low-Temperature Buffer GaAs MESFET Technology for High-Speed Integrated Circuit Applications", pp. 355-357.

Primary Examiner—David Hudspeth
Assistant Examiner—Andrew Sanders
Attorney, Agent, or Firm—Finnegan, Henderson, Farabow, Garrett, and Dunner

[57] ABSTRACT

A source-coupled FET-logic-type logic circuit having level shift elements connected to a high-potential power supply, field-effect transistors, load elements connecting the sources of the field-effect transistors, field-effect transistors coupled between the high-pontential power supply and a low-potential power supply, constant current sources, and complementary output terminals. The circuit further has a field-effect transistors controlled by complementary signals input to two input terminals. The circuit, which is a T flip-flop, further comprises a frequency switching circuit composed of field-effect transistors which are controlled by the signals supplied to two switching terminals. When the first switching terminal is at a high level, the output terminals outputs a signal having the same frequency as the input signal. When the first switching terminal is at a low level, the output terminals outputs a signal having half the frequency of the input signal.

14 Claims, 4 Drawing Sheets

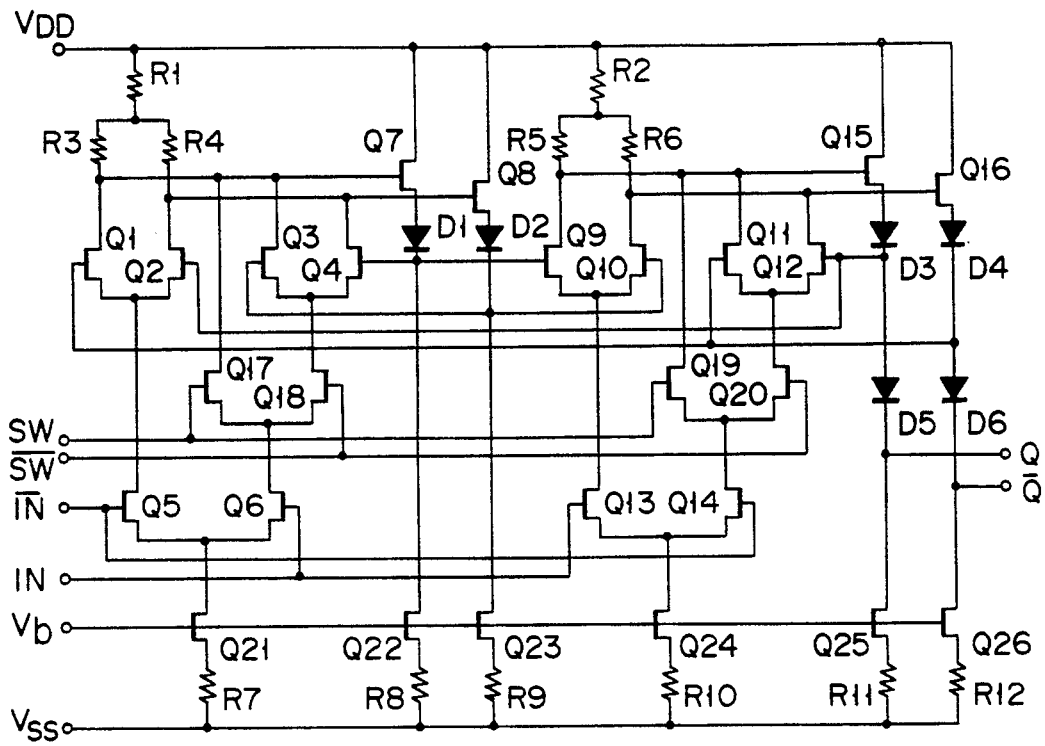
F I G. 6
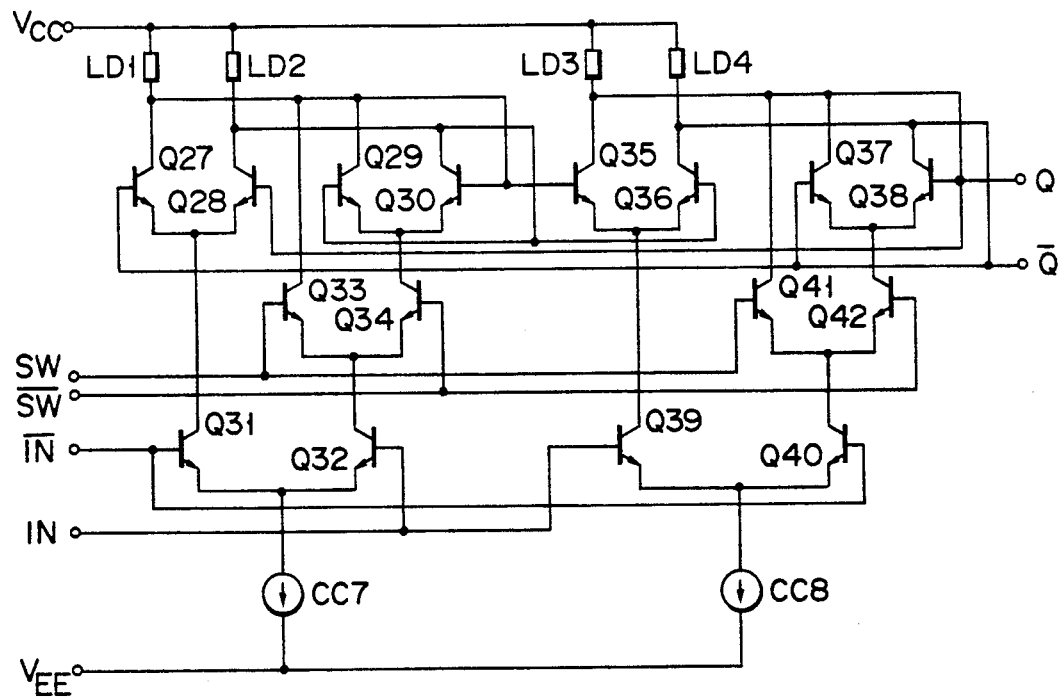
F I G. 7

SOURCE-COUPLED FET-LOGIC-TYPE LOGIC CIRCUIT

BACKGROUND OF THE INVENTION

1. Field of the Invention

This invention relates to the logic circuit using field effect transistors (FET) and bipolar transistors, and more particularly, to the source-coupled FET-logic-type logic circuit to be used for digital integrated circuits.

2. Description of the Related Art

A prescribed signal (e.g. signal with ½ frequency of clock signal) has been obtained so far by inputting the reference signal to a T-flip-flop circuit and fetching the output signal of the T-flip-flop circuit.

For mobile radio equipment for communication, however, it may be necessary to separately fetch the signal with the same frequency as the reference signal and that with ½ frequency of the reference signal according to necessity.

Therefore, to configure the equipment with the source-coupled FET-logic (hereafter called SCFL)-type logic circuit, for example, the following logic circuit has been used.

That is, as is shown in FIG. 8, the reference signal input from the input terminal IN is input to a selection circuit directly or through the T-flip-flop circuit and the reference signal is output to the output terminal of the selection circuit. By switching the level of the switching terminal, either the signal with the same frequency as the reference signal or that with ½ frequency of it is output.

FIG. 1 shows the configuration of the T-flip-flop circuit and FIG. 2 the block diagram of the selection circuit.

As is illustrated in FIG. 1, one of the electrodes of level shift element LS1 is connected to a high-potential power supply $V_{DD}$, while the other end is connected to one end of load elements LD1 and LD2.

Load elements LD1 and LD2 are connected, at the other end, to the drain electrodes of field effect transistors (FET) Q1 and Q2, respectively.

The drain electrodes of FETs Q1 and Q2 connect with the drain electrodes of FETs Q3 and Q4, respectively.

The source electrodes of the FETs Q1 and Q2 are connected each other, which are connected to the drain of FET Q5 whose gate electrode connects with the input terminal $\overline{IN}$. Similarly, the source electrodes of the FETs Q3 and Q4 are connected to each other, the source gate electrodes further are connected to the drain electrode of FET Q6 whose gate electrode is connected to the input terminal IN. In addition, the source electrodes of FETs Q5 and Q6 are connected each other, and also to a low-potential power supply $V_{SS}$ by constant current source CC1.

The drain electrodes of the FETs Q1 and Q2 are connected to the gate electrodes of FETs Q7 and Q8 whose drain electrodes are connected to the high-voltage power source, and whose source electrodes are connected to one end of level shift elements LS2 and LS3, respectively. The other ends of level shift elements LS2 and LS3 are connect to the low-voltage power supply $V_{SS}$ by constant current source CC2 and CC3.

Meanwhile, one of the electrodes of level shift element LS4 is connected to the high-potential power supply $V_{DD}$, and the other end thereof is connected to one end of load elements LD3 and LD4. The other ends of load elements LD3 and LD4 are connected to the drain electrodes of FETs Q9 and Q10. The drain electrodes of FETs Q9 and Q10 connect with the drain electrodes of FETs Q11 and Q12.

The source electrodes of the FETs Q9 and Q10 are connected each other, which are connected to FET Q13 whose gate electrode connects with the input terminal IN. Similarly, the source electrodes of the FETs Q11 and Q12 are connected each other, which are connected to FET Q14 whose gate electrode connects with the input terminal $\overline{IN}$. In addition, the source electrodes of FETs Q13 and Q14 are connected each other, and also to the low-voltage power supply $V_{SS}$ by constant current source CC4.

The gate electrodes of FETs Q9, Q10, Q11, and Q12 connect with the gate electrodes of FETs Q4, Q3, Q1, and Q2, respectively. The drain electrodes of the FETs Q9 and Q10 connect with the gate electrodes of FETs Q15 and Q16 whose drains are connected to power supply Vdd and whose source electrodes connect with level shift elements LS5 and LS6, respectively.

Level shift elements LS5 and LS6 connect with the negative-voltage power supply $V_{SS}$ through level shift element LS7 and constant current source CC5 and through level shift element LS8 and constant current source CC6, respectively.

In addition, the junction between level shift elements LS6 and LS8 connects with the gate electrodes of FETs Q1 and Q11. Similarly, the junction between level shift elements LS5 and LS7 connects with the gate electrodes of FETs Q2 and Q12. The output terminal Q connects with the junction between level shift element LS7 and constant current source CC5 and output terminal $\overline{Q}$ with level shift element LS8 and constant current source CC6 respectively.

The following describes the configuration of the selection circuit in FIG. 2. This selection circuit comprises level shift elements LS1 through LS3, load elements LD1 and LD2, FETs Q1 through Q8, and constant current sources CC1 through CC3, which has the same configuration as the portion shown by the reference numeral 10 of the T-flip-flop circuit in FIG. 1.

Therefore, only the portion different from the circuit in FIG. 1 is described below. In FIG. 2, input terminals A, $\overline{A}$, B and $\overline{B}$ are connected to the gate electrodes of FETs Q1 through Q4, respectively. The gate electrodes of FETs Q5 and Q6 connect with switching terminals SW and $\overline{SW}$, respectively. Output terminals Q and $\overline{Q}$ are connected to the junction between level shift element LS3 and constant current source CC3 and that between level shift element LS2 and constant current source CC2 respectively.

In the SCFL-type logic circuit thus configured, if switching terminal SW is brought under high level, the signal with the same frequency as the input signal is output. Meanwhile, if switching terminal SW is brought under low level, the signal with ½ frequency of the input signal is output.

However, the SCFL-type logic circuit having the configuration has the following problem. That is, because the circuit requires a selection circuit in addition to T-flip-flop circuit, the number of elements increases. Therefore, a large area is necessary, resulting in decrease of integration.

In view of the input terminal side, because the fan-in count equals 2, the current driving capacity at the first stage of this circuit must be increased. Therefore, it is necessary to increase the current to be given to the first-state circuit. This interrupts the power consumption from decreasing. On the contrary, unless the current to be given to the first stage is increased, a high circuit operation cannot be obtained.

SUMMARY OF THE INVENTION

Accordingly, the purpose of this invention is to provide a source-coupled FET-logic-type logic circuit capable of accelerating the circuit operation without decreasing the integration due to increase of the number of elements and without increasing the current to be given to the circuit.

According to an aspect of the present invention, there is provided logic circuit comprising:

- a first load element connected at one end to a high-potential power supply;
- a second load element connected, at one end, to the high-potential power supply;
- first switching means having a control electrode, and a current path connected, at one end, to the other end of the first load element;
- second switching means having a control electrode, and a current path connected, at one end, to the other end of the second load element and, at the other end, to the other end of the current path of the first switching means;
- third switching means having a control electrode, and a current path connected, at one end, to the one end of the current path of the first switching means;
- fourth switching means having a control electrode, and a current path connected, at one end, to the one end of the current path of the second switching means and, at the other end, to the other end of the current path of the third switching means;
- fifth switching means having a control electrode connected to a first switching terminal for supplying a complementary signal thereto, and a current path connected, at one end, to the one end of the current path of the first switching means;
- sixth switching means having a control electrode connected to a second switching terminal for supplying a complementary signal thereto, and a current path connected, at one end, to the other ends of the current paths of the third and fourth switching means and, at the other end, to the other end of the current path of the fifth switching means;
- seventh switching means having a control electrode connected to a first input terminal for supplying a complementary signal therefrom, and a current path connected, at one end, to the other ends of the current paths of the first and second switching means;
- eighth switching means having a control electrode connected to a second input terminal for supplying a complementary signal therefrom, and a current path connected, at one end, to the other ends of the current paths of the fifth and sixth switching means and, at the other end, to the other end of the current path of the seventh switching means;
- a first constant current source connected between the other ends of the seventh and eighth switching means, on the one hand, and the low-potential power supply, on the other hand;
- ninth switching means having a control electrode connected to the one end of the current path of the first switching means, and a current path connected, at one end, to the high-potential power supply and, at the other end, to the control electrode of the fourth switching means;
- tenth switching means having a control electrode connected to the one end of the current path of the second switching means, and a current path connected, at one end, to the high potential power supply and, at the other end, to the control electrode of the third switching means;
- a second constant current source connected between the other end of the current path of the ninth switching means and the low-potential power supply;
- a third constant current source connected between the other end of the current path of the tenth switching means and the low-potential power supply;
- a third load element connected, at one end, to the high-potential power supply;
- a fourth load element connected, at one end, to the reference potential;
- eleventh switching means having a control electrode connected to the control electrode of the fourth switching means, and a current path connected, at one end, to the third load element;
- twelfth switching means having a control electrode connected to the control electrode of the third switching means, and a current path connected, at one end, to the fourth load element and, at the other end, to the other end of the current path of the eleventh switch means;
- thirteenth switching means having a control electrode connected to the control electrode of the first switching means, and a current path connected, at one end, to the one end of the current path of the eleventh switching means;
- fourteenth switching means having a control electrode connected to the control electrode of the second switching means, and a current path connected, at one end, to the one end of the current path of the twelfth switching means and, at the other end, to the other end of the current path of the thirteenth switching means;
- fifteenth switching means having a control electrode connected to the first switching terminal, and a current path connected, at one end, to the one end of the current path of the eleventh switching means;
- sixteenth switching means having a control electrode connected to the second switching terminal, and a current path connected, at one end, to the other ends of the current paths of the thirteenth and fourteenth switching means and, at the other end, to the other end of the current path of the fifteenth switching means;
- seventeenth switching means having a control electrode connected to the second input terminal, and a current path connected, at one end, to the other ends of the current paths of the eleventh and twelfth switching means;
- eighteenth switching means having a control electrode connected to the first input terminal, and a current path connected, at one end, to the other ends of the current paths of the fifteenth and sixteenth switching means and, at the other end, to the other end of the current path of the seventeenth switching means;

a fourth constant current source connected between the other ends of the seventeenth and eighteenth switching means, one the one hand, and the negative voltage source, on the other hand;

nineteenth switching means having a control electrode connected to the one end of the current path of the eleventh switching means, and a current path connected, at one end, to the reference potential and, at the other end, to the control electrode of the fourteenth switching means and also to a first output terminal for supplying a complementary signal thereto;

twentieth switching means having a control electrode connected to the one end of the current path of the twelfth switching means, and a current path connected, at one end, to the reference potential and, at the other end, to the control electrode of the thirteenth switching means and also to a second output terminal for supplying a complementary signal thereto;

a fifth constant current source connected between the other end of the current path of the nineteenth switching means and the low-potential power supply; and a sixth constant current source connected between the other end of the current path of the twentieth switching means and the low-potential power supply.

According to another aspect of the present invention, there is provided logic circuit comprising:

a first load element connected, at one end, to a high-potential power supply;

a second load element connected, at one end, to the reference potential;

a first bipolar transistor having a base, a collector connected to the other end of the first load element, and an emitter;

a second bipolar transistor having a base, a collector connected to the other end of the second load element, and an emitter connected to the emitter of the first bipolar transistor;

a third bipolar transistor having a base, a collector connected to the collector of the first bipolar transistor, and an emitter;

a fourth bipolar transistor having a base connected to the collector of the third bipolar transistor, a collector connected to the collector of the second bipolar transistor and also to the base of the third bipolar transistor, and an emitter connected to the emitter of the third bipolar transistor;

a fifth bipolar transistor having a collector connected to the collector of the first bipolar transistor, an emitter, and a base connected to a first switching terminal for supplying a complementary signal thereto;

a sixth bipolar transistor having a collector to the emitters of the third and fourth bipolar transistor, an emitter connected to the emitter of the fifth bipolar transistor, and a base connected to a second switching terminal for supplying a complementary signal thereto;

a seventh bipolar transistor having a collector connected to the emitters of the first and second bipolar transistors, an emitter, and a base connected to a first input terminal for supplying a complementary signal therefrom;

an eighth bipolar transistor having a collector connected to the emitters of the fifth and sixth bipolar transistors, an emitter connected to the emitter of the seventh bipolar transistor, and a base connected to a second input terminal for supplying a complementary signal therefrom;

a first constant current source connected between the emitters of the seventh and eighth bipolar transistors, one the one hand, and a low-potential power supply, on the other hand;

a third load element connected, at one end, to the high-potential power supply;

a fourth load element connected, at one end, to the reference potential;

a ninth bipolar transistor having a collector connected to the third load element, an emitter, and a base connected to the base of the fourth bipolar transistor;

a tenth bipolar transistor having a collector connected to the fourth load element, an emitter connected to the emitter of the ninth bipolar transistor, and a base connected to the base of the third bipolar transistor;

an eleventh bipolar transistor having a collector connected to the collector of the ninth bipolar transistor, an emitter, and a base connected to the base of the first bipolar transistor and also to a first output terminal for supplying a complementary signal thereto;

a twelfth bipolar transistor having a collector connected to the collector of the tenth bipolar transistor and also to the base of the eleventh bipolar transistor, an emitter connected to the emitter of the eleventh bipolar transistor, and a base connected to the base of the second bipolar transistor and also to the collector of the eleventh bipolar transistor;

a thirteen bipolar transistor having a collector connected to the collector of the ninth bipolar transistor, an emitter, and a base connected to the first switching terminal;

a fourteenth bipolar transistor having a collector connected to the emitters of the eleventh and twelfth bipolar transistors, an emitter connected to the emitter of the thirteenth bipolar transistor, and a base connected the second switching terminal;

a fifteenth bipolar transistor having a collector connected to the emitters of the ninth and tenth bipolar transistors, an emitter, and a base connected to the second input terminal;

a sixteenth bipolar transistor having a collector connected to the emitters of the thirteenth and fourteenth bipolar transistors, an emitter connected to the emitter of the fifteenth bipolar transistor, and a base connected to the first input terminal; and a second constant current source connected between the emitters of the fifteenth and sixteenth bipolar transistors, on the one hand, and the low-potential power supply, on the other hand.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is the circuit block diagram showing the SCFL-type logic circuit in the second embodiment of this invention;

FIG. 7 is the circuit block diagram showing the ECL (emitter coupled logic)-type logic circuit in the third embodiment of this invention.

DETAILED DESCRIPTION OF THE PREFERRED EMBODIMENTS

The following is the description of the embodiments of this invention using the drawings. In the embodiments, the portion same as in the prior art previously mentioned is provided with the same reference number and its description is omitted.

Figure 1:
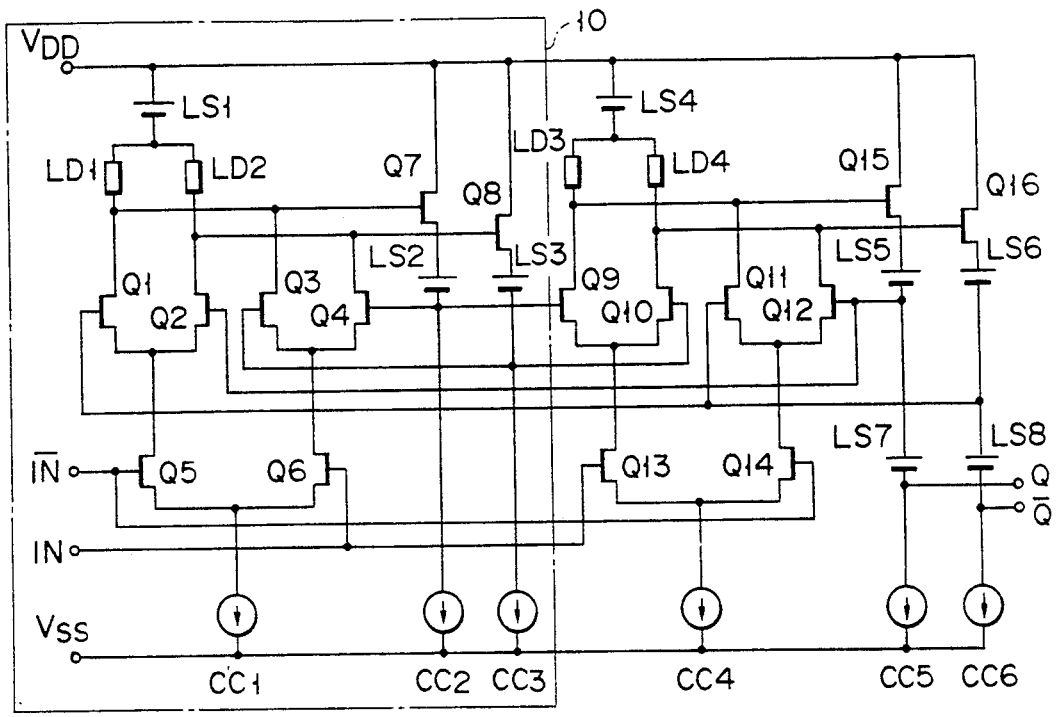
FIG. 1 is the circuit block diagram showing the T-flip-flop circuit of the SCFL-type logic circuit in the prior art.
Figure 2:
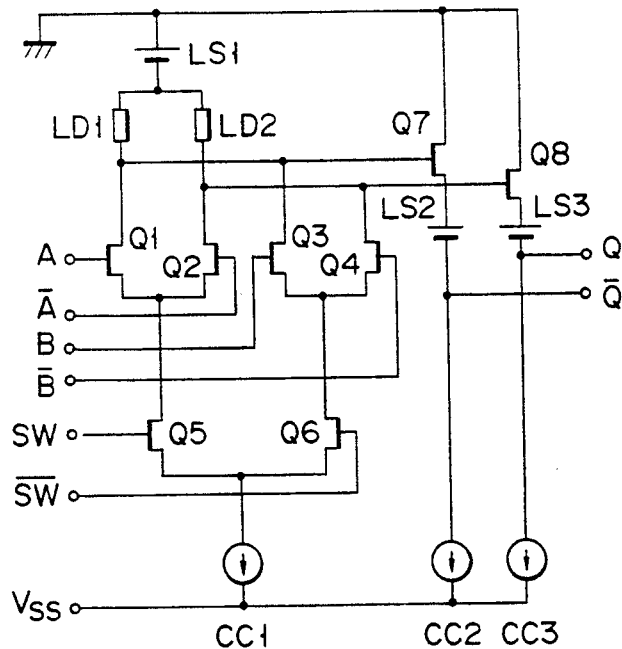
FIG. 2 is the circuit block diagram showing the selection circuit in FIG. 8.
Figure 3:
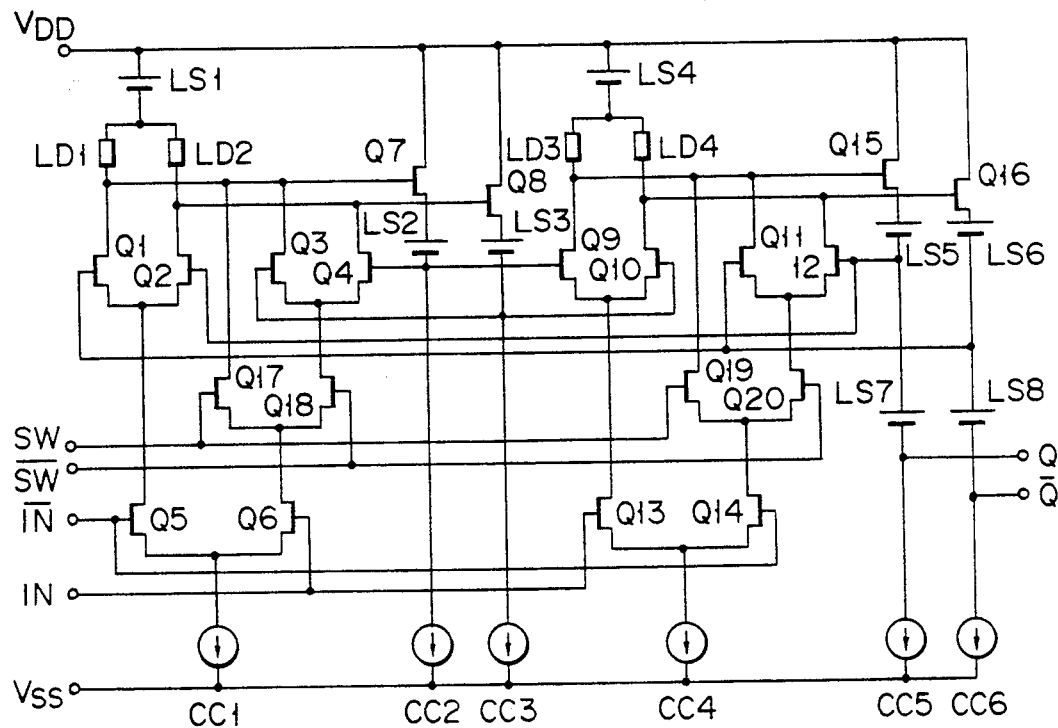
FIG. 3 is the circuit block diagram showing source-coupled FET-logic-type logic circuit related to the first embodiment of this invention.

FIG. 3 shows the circuit block diagram of the SCFL-type logic circuit related to the first embodiment according to this invention. In FIG. 3, one of the electrodes of level shift element LS1 is connected a high-potential power supply $V_{DD}$, and the other end thereof is connected to one end of load element LD1 and LD2.

The other ends of load elements LD1 and LD2 are connected to the drain electrodes of field effect transistors (FET) Q1 and Q2, respectively. The drain electrodes of FETs Q1 and Q2 are connected to those of FETs Q3 and Q4, respectively.

The source electrodes of the FETs Q1 and Q2 are connected each other, which are connected to the drain electrode of FET Q5 whose gate electrode is coupled to input terminal $\overline{IN}$. The drain electrode of FET Q1 is connected to the drain electrode of FET Q17 whose gate electrode is coupled to switching terminal SW The source electrodes of the FETs Q3 and Q4 are connected to each other, and also to the drain electrode of FET Q18 whose gate electrode is connected to switching terminals $\overline{SW}$. The source electrodes of FETs Q17 and Q18 are connected to each other, and also to the drain electrode of FET Q6 whose gate electrode is connected to an input terminal IN. The source electrodes of FETs Q5 and Q6 are connected to each other, and also to a low-potential power supply $V_{SS}$ by a constant current source CC1.

The drain electrodes of the FETs Q1 and Q2 are connected to the gate electrodes of FETs Q7 and Q8 whose drain electrodes are grounded and whose source electrodes are connected to level shift elements LS2 and LS3, respectively. The level shift elements LS2 and LS3 are connected to the low-potential power supply $V_{SS}$ by constant current sources CC2 and CC3.

Meanwhile, one of the electrodes of level shift element LS4 is connected to the high-potential power supply $V_{DD}$, and the other end thereof is connected to one end of load elements LD3 and LD4. The other ends of load elements LD3 and LD4 are connected to the drain electrodes of FETs Q9 and Q10, respectively. The drain electrodes of FETs Q9 and Q10 are connected to those of FETs Q11 and Q12, respectively. The source electrodes of the FETs Q9 and Q10 are connected to each other, and also to the drain electrode of FET Q13 whose gate electrode is coupled to input terminal $\overline{IN}$. The drain electrode of FET Q9 is connected to that of FET Q19 whose gate electrode is connected to switching terminal SW.

The source electrodes of the said FETs Q11 and Q12 are connected to each other, and also to the drain electrode of FET Q20 whose gate electrode connects with switching terminal $\overline{SW}$. The source electrodes of FETs Q19 and Q20 are connected to each other, and also to the drain of FET Q14 whose gate electrode is connected to input terminal IN. The source electrodes of FETs Q13 and Q14 are connected to each other, and also to the low-potential power supply $V_{SS}$ by constant current source CC4.

The gate electrodes of the FETs Q9 to Q12 are connected to those of FETs Q4, Q3, Q1, and Q2, respectively. The drain electrodes of FETs Q9 and Q10 are connected to the gate electrodes of FETs Q15 and Q16 whose drain electrodes are coupled to the high-potential power supply $V_{DD}$, respectively, and whose source electrodes are connected to one end of level shift elements LS5 and LS6, respectively. The other ends of level shift elements LS5 and LS6 are connected to the low-potential power supply $V_{SS}$ by level shift element LS7 and constant current source CC5, by level shift element LS8, and constant current source CC6, respectively.

In addition, the junction between level shift elements LS6 and LS8 connects with the gate electrodes of FETs Q1 and Q11. Similarly, the junction between level shift elements LS5 and LS7 connects with the gate electrodes of FETs Q2 and Q12.

The output terminal Q is connected to the junction between level shift element LS7 and constant current source CC5 and the output terminal $\overline{Q}$ to the junction between level shift element LSB and constant current source CC6.

The operation of the logic circuit described above will now be explained, with reference to FIG. 3.

First it will be explained how the logic circuit when the switching terminals SW and $\overline{SW}$ are set at a low level and a high level. When two complementary signals, which are at the low level and the high level, respectively, are input to the input terminals IN and $\overline{IN}$, FETs Q5 and Q14 are turned on, whereas FETs Q6 and Q13 are turned off. As a result, FETs Q18 and Q20 are on, and FETs Q17 and Q19 are off. Assuming that the output terminals Q and $\overline{Q}$ are at the low level and the high level, respectively, then FET Q11 is turned off, and FET Q12 is turned on. Thus, an electric current flows through the path of: $V_{DD} \rightarrow LS4 \rightarrow LD4 \rightarrow Q12 \rightarrow Q20 \rightarrow Q14 \rightarrow CC4 \rightarrow V_{SS}$.

Hence, the output terminals Q and $\overline{Q}$ remain at the high level and the low level, respectively. Thus, as long as the input the output signal of the logic circuit remains at the same level as before.

When the output terminal Q and $\overline{Q}$ are at the high level and the low level, respectively, FET Q1 is off, and FET Q2 is on. Hence, an electric current flows through the path of: $V_{DD} \rightarrow LS1 \rightarrow LD2 \rightarrow Q2 \rightarrow Q5 \rightarrow CC1 \rightarrow V_{SS}$. Thus, the gates of FETs Q4 and Q9 are at the high level, whereas the gates of FETs Q3 and Q10 are at the low level.

When two complementary signals, which are at the high level and the low level, are input to the input terminals IN and $\overline{IN}$, FETs Q6 and Q13 are turned on, whereas FETs Q5 and Q14 are turned off. Also, FETs Q9 and Q10 are turned on and off, respectively. As a result, an electric current flows through the path of: $V_{DD} \rightarrow LS4 \rightarrow LD3 \rightarrow Q9 \rightarrow Q13 \rightarrow CC4 \rightarrow V_{SS}$. Hence, the drain current of FET Q9 is at the low level whereas that of FET Q10 is at the high level. Therefore, the output terminals Q and $\overline{Q}$ are at the low level and the high level, respectively.

Figure 4:
FIGS. 4, 5A, and 5B are the timing chart of the circuit in FIG. 3, which show the input signal, the output signal when switching terminal SW is low, and the output signal when the switching terminal is high, in order.
Figure 5A:

As may be understood, when the potential of the input terminal rises from the low level to the high level, the output level of the logic circuit is inverted. As a result of this, the logic circuit outputs signals at half the frequency of the input signal, as is illustrated in FIG. 4 which represents the waveform of the input signal, and in FIG. 5A showing the waveform of the signal output from the output terminal Q.

Now, it will be explained how the logic circuit operates when the switching terminals SW and $\overline{SW}$ are set at the high level and the low level. In this case, when two complementary signals, which are at the low level and the high level, respectively, are input to the input terminals IN and $\overline{IN}$, FETs Q5 and Q14 are turned on, whereas FETs Q6 and Q13 are turned off. As a result, FETs Q18 and Q20 are on, and FETs Q17 and Q19 are off. Assuming that the output terminals Q and $\overline{Q}$ are at the low level and the high level, respectively, then FET Q11 is turned off, and FET Q12 is turned on. Thus, an electric current flows through the path of: $V_{DD} \rightarrow LS4 \rightarrow LD4 \rightarrow Q12 \rightarrow Q20 \rightarrow Q14 \rightarrow CC4 \rightarrow V_{SS}$. Hence, the output terminals Q and $\overline{Q}$ remain at the high level and the low level, respectively. Thus, as long as the input terminal IN is at the low level, the output signal of the logic circuit remains at the same level as before.

When the output terminals Q and $\overline{Q}$ are at the high level and the low level, respectively, FET Q1 is off, and FET Q2 is on. Hence, an electric current flows through the path of: $V_{DD} \rightarrow LS1 \rightarrow LD2 \rightarrow Q2 \rightarrow Q5 \rightarrow CC1 \rightarrow V_{SS}$. Thus, the gates of FETs Q4 and Q9 are at the high level, whereas the gates of FETs Q3 and Q10 are at the low level.

When two complementary signals, which are at the high level and the low level, are input to the input terminals IN and $\overline{IN}$, FETs Q6 and Q13 are turned on, whereas FETs Q5 and Q14 are turned off. Also, FETs Q9 and Q10 are turned on and off, respectively. As a result, an electric current flows through the path of: $V_{DD} \rightarrow LS4 \rightarrow LD3 \rightarrow Q9 \rightarrow Q13 \rightarrow CC4 \rightarrow V_{SS}$. Hence, the drain current of FET Q19 is at the low level, whereas that of FET Q10 is at the high level. Therefore, the output terminals Q and $\overline{Q}$ are at the low level and the high level, respectively.

As may be understood, when the potential of the input terminal IN rises from the low level to the high level, the output level of the logic circuit is inverted. As a result of this, the logic circuit outputs signals at half the frequency of the input signal, as is illustrated in FIG. 4 which represents the waveform of the input signal, and in FIG. 5A which shows the waveform of the signal output from the output terminal Q.

It will now be explained how the logic circuit operates when the switching terminals SW and $\overline{SW}$ are set at the high level and the low level. When FETs Q6 and Q13 are on, and FETs Q5 and Q14 are off, none of FETs Q17, Q18, Q19 and Q20 can form a current path. Hence, the input terminals SW and $\overline{SW}$ remain at the high level and the low level, respectively. Hence, the input terminals IN and $\overline{IN}$ also remain at the high level and the low level, respectively. When the potential of the input terminal IN increases to the high level, the level of the output signal of the logic circuit is inverted.

When two complementary signals, which are at the low level and the high level, are input to the input terminals IN and $\overline{IN}$, FETs Q5 and Q14 are turned on, whereas FETs Q6 and Q13 are turned off. Also, FETs Q17 and Q19 are turned on, whereas FETs Q18 and Q20 are turned off. As a result, an electric current flows through the path of: $V_{DD} \rightarrow LS1 \rightarrow LD1 \rightarrow Q17 \rightarrow Q16 \rightarrow CC1 \rightarrow V_{SS}$. It also flows through the path of: $V_{DD} \rightarrow LS4 \rightarrow LD3 \rightarrow Q19 \rightarrow Q14 \rightarrow CC4 \rightarrow V_{SS}$. Therefore, the output terminals Q and $\overline{Q}$ are set at the low level and the high level, respectively.

Figure 5B:
Figure 8:
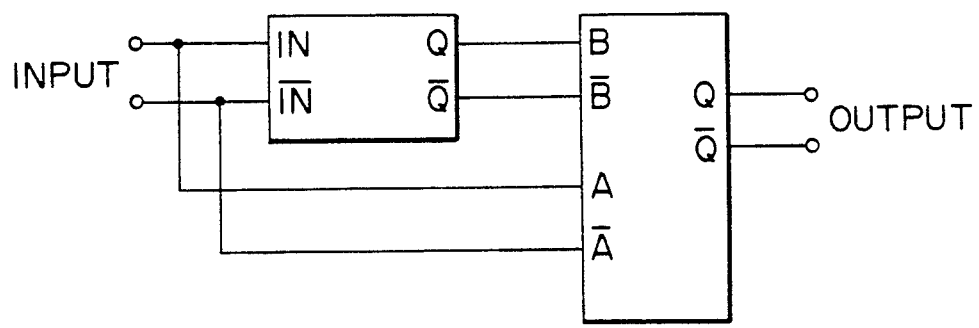
FIG. 8 is a block diagram showing a conventional T-flip-flop circuit and selection circuit.

When the potential of the input terminal I falls from the high level to the low level, the signal output from the output terminal Q has the waveform shown in FIG. 5B. As is evident from FIG. 5B, the logic circuit outputs signals at the same frequency as that of the input signal.

Thus, the logic circuit having the configuration previously mentioned makes it possible to separately fetch the signal with the same frequency as the reference signal to be input and that with $\frac{1}{2}$ frequency of the reference signal without installing a selection circuit. Therefore, it is possible to decrease the circuit area, improve the integration, and decrease the power consumption.

In addition, because the fan-in count viewed from the input terminal side is "1", it is also possible to decrease the driving capacity at the first stage compared with the existing SCFL-type logic circuit. Therefore, this also makes it possible to decrease the power consumption.

It is also possible to make level shift elements LS1 through LS6 unnecessary depending on selection of FET threshold voltage.

Moreover, level shift elements LS7 and LS8 should be set according to the input level of the logic circuit to the next stage.

FIG. 6 is the circuit block diagram showing the second embodiment of this invention. In this embodiment, the circuit is configured by concreting the circuit elements configured as shown in FIG. 3 as follows. The description of configuration and overall operation of the elements other than those described here is omitted because it is the same as the configuration in the first embodiment. That is, resistance R1 through R6 are connected instead of level shift elements LS1 and LS4 and load elements LD1 through LD4 in the first embodiment. Diode D1 through D6 are connected instead of level shift elements LS2, LS3, and LS5 through LS8. Constant current sources CC1 through CC6 comprise circuits consisting of FET Q21 and resistance R7, FET Q22 and resistance R8, FET Q23 and resistance R9, FET Q24 and resistance R10, FET Q25 and resistance R11, and FET Q26 and resistance R12, respectively. In FIG. 6, "$V_b$" represents the prescribed external bias power supply.

This makes it possible to separately fetch the signal with the frequency same as the reference signal to be input and that with $\frac{1}{2}$ frequency of the said reference signal. FIG. 7 is the circuit block diagram showing the third embodiment of this invention. This embodiment shows a deformed example when bipolar transistors are connected in the circuit in FIG. 3 instead of field effect transistors. Therefore, only the configuration is described below but the description of overall operation is omitted because it is the same as that of the first embodiment.

In FIG. 7, collector electrodes of bipolar transistors Q27 and Q28 are connected to high-potential power supply $V_{CC}$ through load elements LD1 and LD2 respectively, which connect with the collector electrodes of bipolar transistors Q30 and Q31, respectively. The emitter electrodes of the transistors Q27 and Q28 are connected each other, which are connected to the collector electrode of bipolar transistor Q31 whose base electrode connects with input terminal IN. The collector electrode of transistor Q27 connects with the collector electrode of bipolar transistor Q33 whose base electrode is connected to switching terminal SW.

The emitter electrodes of the transistors Q29 and Q30 are connected each other, which connect with the collector electrode of bipolar transistor Q34 whose base electrode is connected to switching terminal $\overline{SW}$. The emitter electrodes of transistors Q33 and Q34 are connected each other, which are connected to the collector electrode of bipolar transistor Q32 whose base electrode is connected to input terminal $\overline{IN}$. The emitter electrodes of transistors Q31 and Q32 are connected each other, which are connected to low-potential power supply $V_{EE}$ through constant current source CC7.

Meanwhile, the collector electrodes of bipolar transistors Q35 and Q36 are connected to the high-potential power supply $V_{CC}$ through load elements LD3 and LD4 respectively. The collector electrodes of transistors Q35 and Q36 connect with the collector electrodes of bipolar transistors Q37 and Q38, respectively. The emitter electrodes of the transistors Q35 and Q36 are connected each other, which are connected to bipolar transistor Q39 whose base electrode is connected to input terminal IN.

The collector electrode of transistor Q35 connects with the collector electrode of bipolar transistor Q41 whose base electrode is connected to switching terminal SW.

The emitter electrodes of the transistors Q37 and Q38 are connected each other, which connect with the collector electrode of bipolar transistor Q42 whose base electrode is connected to switching terminal $\overline{SW}$ similarly to transistor Q41. The emitter electrodes of transistors Q41 and Q42 are connected each other, which are connected to the collector electrode of bipolar transistor Q40 whose base electrode is connected to input terminal $\overline{IN}$. The emitter electrodes of transistors Q39 and Q40 are connected each other, which are connected to low-potential power supply $V_{EE}$ through constant current source CC8.

The base electrodes of the transistors Q35 through Q38 are connected to those of transistors Q30, Q29, Q27, and Q28, respectively. Output terminal Q is connected to the junction between the collector electrode of the transistor Q37 and the base electrode of transistor Q38, and output terminal $\overline{Q}$ to the junction between the collector electrode of transistor Q38 and the base electrode of transistor Q37.

As mentioned, this invention makes it possible to provide a source-coupled FET-logic-type logic circuit capable of increasing the circuit operation speed without decreasing the integration due to increase of the number of elements and increasing the current to be given to the circuit at the first stage.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. A logic circuit comprising:
   a first load element connected at one end to a high-potential power supply;
   a second load element connected, at one end, to the high-potential power supply;
   first switching means having a control electrode and a current path connected, at one end, to the other end of said first load element;
   second switching means having a control electrode, and a current path connected, at one end, to the other end of said second load element and, at the other end, to the other end of the current path of said first switching means;
   third switching means having a control electrode, and a current path connected, at one end, to the one end of the current path of said first switching means;
   fourth switching means having a control electrode, and a current path connected, at one end, to the one end of the current path of said second switching means and, at the other end, to the other end of the current path of said third switching means;
   fifth switching means having a control electrode connected to a first switching terminal for supplying a complementary signal thereto, and a current path connected, at one end, to said one end of the current path of said first switching means;
   sixth switching means having a control electrode connected to a second switching terminal for supplying a complementary signal thereto, and a current path connected, at one end, to the other ends of the current paths of said third and fourth switching means and, at the other end, to the other end of the current path of said fifth switching means;
   seventh switching means having a control electrode connected to a first input terminal for supplying a complementary signal therefrom, and a current path connected, at one end, to the other ends of the current paths of said first and second switching means;
   eighth switching means having a control electrode connected to a second input terminal for supplying a complementary signal therefrom, and a current path connected, at one end, to the other ends of the current paths of said fifth and sixth switching means and, at the other end, to the other end of the current path of said seventh switching means;
   a first constant current source connected between the other ends of said seventh and eighth switching means, on the one hand, and a low-potential power supply, on the other hand;
   ninth switching means having a control electrode connected to said one end of the current path of said first switching means, and a current path connected, at one end, to the high-potential power supply and, at the other end, to the control electrode of said fourth switching means;

tenth switching means having a control electrode connected to said one end of the current path of said second switching means, and a current path connected, at one end, to the high-potential power supply and, at the other end, to the control electrode of said third switching means;

a second constant current source connected between the other end of the current path of said ninth switching means and said low-potential power supply;

a third constant current source connected between the other end of the current path of said tenth switching means and said low-potential power supply;

a third load element connected, at one end, to the high-potential power supply;

a fourth load element connected, at one end, to the high-potential power supply;

eleventh switching means having a control electrode connected to the control electrode of said fourth switching means, and a current path connected, at one end, to said third load element;

twelfth switching means having a control electrode connected to the control electrode of said third switching means, and a current path connected, at one end, to said fourth load element and, at the other end, to the other end of the current path of said eleventh switching means;

thirteenth switching means having a control electrode connected to the control electrode of said first switching means, and a current path connected, at one end, to said one end of the current path of said eleventh switching means;

fourteenth switching means having a control electrode connected to the control electrode of said second switching means, and a current path connected, at one end, to said one end of the current path of said twelfth switching means, and, at the other end, to the other end of the current path of said thirteenth switching means;

fifteenth switching means having a control electrode connected to said first switching terminal, and a current path connected, at one end, to said one end of the current path of said eleventh switching means;

sixteenth switching means having a control electrode connected to said second switching terminal, and a current path connected, at one end, to the other ends of the current paths of said thirteenth and fourteenth switching means and, at the other end, to the other end of the current path of said fifteenth switching means;

seventeenth switching means having a control electrode connected to said second input terminal, and a current path connected, at one end, to the other ends of the current paths of said eleventh and twelfth switching means;

eighteenth switching means having a control electrode connected to said first input terminal, and a current path connected, at one end, to the other ends of the current paths of said fifteenth and sixteenth switching means and, at the other end, to the other end of the current path of said seventeenth switching means;

a fourth constant current source connected between the other ends of said seventeenth and eighteenth switching means, one the one hand, and said low-potential power supply, on the other hand;

nineteenth switching means having a control electrode connected to said one end of the current path of said eleventh switching means, and a current path connected, at one end, to the high-potential power supply and, at the other end, to the control electrode of said fourteenth switching means and also to a first output terminal for supplying a complementary signal thereto;

twentieth switching means having a control electrode connected to said one end of the current path of said twelfth switching means, and a current path connected, at one end, to the high-potential power supply and, at the other end, to the control electrode of said thirteenth switching means and also to a second output terminal for supplying a complementary signal thereto;

a fifth constant current source connected between the other end of the current path of said nineteenth switching means and said low-potential power supply; and a sixth constant current source connected between the other end of the current path of said twentieth switching means and said negative voltage source.

2. A circuit according claim 1, wherein said first to twentieth switching means comprise field-effect transistors.

3. A circuit according to claim 1, further comprising a first level shift element connected between said high-potential power supply and said one end of the current path of each of said first and second load elements, and a second level shift element connected between said high-potential power supply and said one end of the current path of each of said third and fourth load elements.

4. A circuit according to claim 3, further comprising a third level shift element connected between the other end of the current path of said ninth switching means and the control electrode of said fourth switching means, a fourth level shift element connected between the other end of the current path of said tenth switching means and the control electrode of said third switching means, a fifth level shift element connected between the other end of the current path of said nineteen switching means and the control electrode of said fourteenth switching means, and a sixth level shift element connected between the other one of the current path of said twentieth switching means and the control electrode of said thirteenth switching means.

5. A circuit according to claim 4, further comprising a seventh level shift element connected between the control electrode of said fourteenth switching means and said first output terminal, and an eighth level shift element connected between the control electrode of said thirteenth switching means and said second output terminal.

6. A circuit according to claim 3, wherein said first and second level shift elements comprise resistors.

7. A circuit according to claim 4, wherein said third to sixth level shift elements comprise diodes.

8. A circuit according to claim 5, wherein said seventh and eighth level shift elements comprise diodes.

9. A circuit according to claim 1, wherein said first to fourth load elements comprise resistors.

10. A circuit according to claim 1, wherein said first to sixth constant current sources comprise field-effect transistors.

11. A circuit according to claim 10, wherein each of said first to sixth constant current sources comprises a series circuit having a resistor and a field-effect transistor.

12. A circuit according to claim 1, wherein said fifth, sixth, fifteenth and sixteenth switching means constitute a frequency switching circuit for a signal to be input.

13. A logic circuit comprising:
- a first load element connected, at one end, to a high-potential power supply;
- a second load element connected, at one end, to the high-potential power supply;
- a first bipolar transistor having a base, a collector connected to the other end of said first load element, and an emitter;
- a second bipolar transistor having a base, a collector connected to the other end of said second load element, and an emitter connected to the emitter of said first bipolar transistor;
- a third bipolar transistor having a base, a collector connected to the collector of said first bipolar transistor, and an emitter;
- a fourth bipolar transistor having a base connected to the collector of said third bipolar transistor, a collector connected to the collector of said second bipolar transistor and also to the base of said third bipolar transistor, and an emitter connected to the emitter of said third bipolar transistor;
- a fifth bipolar transistor having a collector connected to the collector of said first bipolar transistor, an emitter, and a base connected to a first switching terminal for supplying a complementary signal thereto;
- a sixth bipolar transistor having a collector connected to the emitters of said third and fourth bipolar transistor, an emitter connected to the emitter of said fifth bipolar transistor, and a base connected to a second switching terminal for supplying a complementary signal thereto;
- a seventh bipolar transistor having a collector connected to the emitters of said first and second bipolar transistors, an emitter, and a base connected to a first input terminal for supplying a complementary signal therefrom;
- an eighth bipolar transistor having a collector connected to the emitters of said fifth and sixth bipolar transistors, an emitter connected to the emitter of said seventh bipolar transistor, and a base connected to a second input terminal for supplying a complementary signal therefrom;
- a first constant current source connected between the emitters of said seventh and eighth bipolar transistors, one the one hand, and a low-potential power supply source, on the other hand;
- a third load element connected, at one end, to the high-potential power supply;
- a fourth load element connected, at one end, to the high-potential power supply;
- a ninth bipolar transistor having a collector connected to said third load element, an emitter, and a base connected to the base of said fourth bipolar transistor;
- a tenth bipolar transistor having a collector connected to said fourth load element, an emitter connected to the emitter of said ninth bipolar transistor, and a base connected to the base of said third bipolar transistor;
- an eleventh bipolar transistor having a collector connected to the collector of said ninth bipolar transistor, an emitter, and a base connected to the base of said firth bipolar transistor and also to a first output terminal for supplying a complementary signal thereto;
- a twelfth bipolar transistor having a collector connected to the collector of said tenth bipolar transistor and also to the base of said eleventh bipolar transistor, an emitter connected to the emitter of said eleventh bipolar transistor, and a base connected to the base of said second bipolar transistor and also to the collector of said eleventh bipolar transistor;
- a thirteen bipolar transistor having a collector connected to the collector of said ninth bipolar transistor, an emitter, and a base connected to said first switching terminal;
- a fourteenth bipolar transistor having a collector connected to the emitters of said eleventh and twelfth bipolar transistors, an emitter connected to the emitter of said thirteenth bipolar transistor, and a base connected the second switching terminal;
- a fifteenth bipolar transistor having a collector connected to the emitters of said ninth and tenth bipolar transistors, an emitter, and a base connected to said second input terminal;
- a sixteenth bipolar transistor having a collector connected to the emitters of said thirteenth and fourteenth bipolar transistors, an emitter connected to the emitter of said fifteenth bipolar transistor, and a base connected to said first input terminal; and
- a second constant current source connected between the emitters of said fifteenth and sixteenth bipolar transistors, on the other hand, and said low-potential power supply, on the other hand.

14. The circuit according to claim 1, wherein said fifth, sixth, thirteenth and fourteenth switching means constitute a frequency switching circuit for a signal to be input.

* * * * *